US010057474B2

(12) United States Patent
Minamisawa et al.

(10) Patent No.: US 10,057,474 B2
(45) Date of Patent: Aug. 21, 2018

(54) COIL UNIT AND PHOTOGRAPHING OPTICAL DEVICE

(71) Applicant: NIDEC SANKYO CORPORATION, Suwa-gun, Nagano (JP)

(72) Inventors: Shinji Minamisawa, Nagano (JP); Takashi Iwanami, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 15/630,311

(22) Filed: Jun. 22, 2017

(65) Prior Publication Data
US 2017/0374247 A1 Dec. 28, 2017

(30) Foreign Application Priority Data

Jun. 22, 2016 (JP) .................................. 2016-123303

(51) Int. Cl.
*H04N 5/225* (2006.01)
*H04N 5/232* (2006.01)
*H01F 5/04* (2006.01)
*H01F 5/02* (2006.01)
*H05K 1/18* (2006.01)
*H01F 27/28* (2006.01)

(52) U.S. Cl.
CPC .............. *H04N 5/2257* (2013.01); *H01F 5/02* (2013.01); *H01F 5/04* (2013.01); *H01F 27/2823* (2013.01); *H04N 5/2252* (2013.01); *H04N 5/2253* (2013.01); *H04N 5/2254* (2013.01); *H04N 5/23287* (2013.01); *H05K 1/18* (2013.01)

(58) Field of Classification Search
CPC .. H04N 5/2253; H04N 5/2254; H04N 5/2257; H04N 5/2328; H04N 5/23287; H01F 5/02; H01F 5/04
See application file for complete search history.

(56) References Cited

U.S. PATENT DOCUMENTS 9,810,918 B2 * 11/2017 Minamisawa ....... G02B 27/646
2012/0200176 A1 * 8/2012 Park ...................... G02B 7/102
310/12.16

(Continued)

FOREIGN PATENT DOCUMENTS

JP 2015225943 A 12/2015
JP 2016123303 A * 7/2016

OTHER PUBLICATIONS

English Abstract for JP 2016123303 published Jul. 2016.*

Primary Examiner — Daniel M Pasiewicz
(74) Attorney, Agent, or Firm — Cantor Colburn LLP

(57) ABSTRACT

A coil unit may include coils and a coil holding member. An outer peripheral face of the coil holding member includes two side-face pairs, each of which includes a pair of parallel side faces. Each side face includes a protruded part around which the coil is wound and an abutting face with which one end face of the coil is abutted. Two pieces of the coil wound around protruded parts of two paired side faces is formed of one conducting wire. One side faces includes a coil guide part for wiring a crossover wire which connects the coil wound around the protruded part of one side face with the coil wound around the protruded part of the paired side-face pair, the coil guide part being recessed from the abutting face, and a recessed amount of the coil guide part is not less than an outer diameter of the conducting wire.

24 Claims, 8 Drawing Sheets

(56) References Cited

U.S. PATENT DOCUMENTS

| | | | | |
|---|---|---|---|---|
| 2014/0160310 A1* | 6/2014 | Lee | ............... | H04N 5/2257 |
| | | | | 348/208.7 |
| 2015/0201114 A1* | 7/2015 | Shin | ............... | G03B 3/02 |
| | | | | 348/375 |
| 2015/0348688 A1* | 12/2015 | Yanagisawa | ............... | H01F 5/02 |
| | | | | 335/297 |
| 2016/0170227 A1* | 6/2016 | Minamisawa | ............... | G03B 5/00 |
| | | | | 359/557 |
| 2016/0241786 A1* | 8/2016 | Minamisawa | ............... | G03B 5/00 |

* cited by examiner

FIG. 1
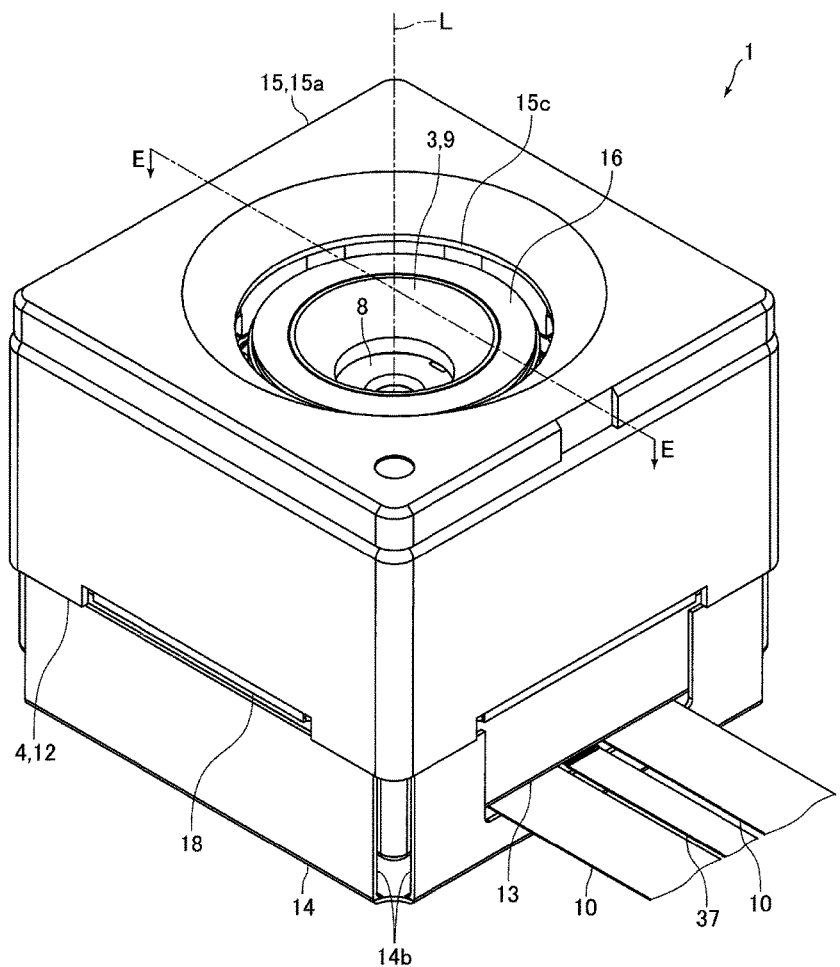
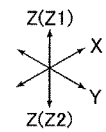

COIL UNIT AND PHOTOGRAPHING OPTICAL DEVICE

CROSS REFERENCE TO RELATED APPLICATION

The present invention claims priority under 35 U.S.C. § 119 to Japanese Application No. 2016-123303 filed Jun. 22, 2016, the entire content of which is incorporated herein by reference.

TECHNICAL FIELD

At least an embodiment of the present invention may relate to a coil unit comprising coils and a coil holding member which holds the coils. Further, at least an embodiment of the present invention may relate to a photographing optical device comprising the coil unit.

BACKGROUND

Conventionally, a coil unit has been known which includes four coils and a holder which holds the four coils (see, for example, Japanese Patent Laid-Open No. 2015-225943). In the coil unit described in the Patent Literature, a side-face pair comprised of a pair of side faces parallel to each other is formed on an outer peripheral face of a holder, and the outer peripheral face of the holder is structured of two side-face pairs. In other words, the outer peripheral face of the holder is structured of four side faces each of which is formed in a flat face shape. Each of the four side faces is formed with a protruded part protruding to an outer side of the holder, and a coil is directly wound around the protruded part. Two coils which are respectively wound around the protruded parts of two side faces structuring one of the two side-face pairs are structured by using one conducting wire. Similarly, the remaining two coils which are respectively wound around the protruded parts of two side faces structuring the other of the two side-face pairs are also structured by using one conducting wire.

In the coil unit described in the Patent Literature, when the coil wound around the protruded parts of one of the two side-face pairs is referred to as a first coil and the coil wound around the protruded parts of the other of the two side-face pairs is referred to as a second coil, in this coil unit, for example, after two first coils are directly wound around the protruded parts, two second coils are directly wound around the different protruded parts. In this case, when a crossover wire serially-connecting two first coils is not appropriately arranged, the crossover wire and the second coil may be overlapped with each other and thereby it may be occurred that the second coil is not orderly wound around.

SUMMARY

In view of the problem described above, at least an embodiment of the present invention may advantageously provide a coil unit which is structured so that an outer peripheral face of a coil holding member which holds coils is formed with a plurality of side-face pairs, each of the side-face pairs is comprised of a pair of side faces parallel to each other and that two of the coils respectively attached to two side faces structuring the side-face pair are structured by using one conducting wire, and that the coil is capable of being orderly wound. Further, at least an embodiment of the present invention may advantageously provide a photographing optical device comprising the coil unit.

According to at least an embodiment of the present invention, there may be provided a coil unit including an even number of coils and a coil holding member which holds the even number of the coils. An outer peripheral face of the coil holding member is formed with two or more side-face pairs, and each of the side-face pairs is comprised of a pair of side faces parallel to each other. The side face is formed with a protruded part around which one of the coils is directly wound, and the protruded part is protruded to an outer side of the coil holding member. The side face is formed with an abutting face with which one end face of the coil wound around the protruded part is abutted, and two pieces of the coil each of which is wound around each of the protruded parts of two side faces structuring the side-face pair is structured by using one conducting wire. In addition, at least one of the side faces is formed with a coil guide part for wiring a crossover wire which serially connects the coil wound around the protruded part of one side face structuring the side-face pair with the coil wound around the protruded part of the other side face structuring the side-face pair, and the coil guide part is recessed from the abutting face and a recessed amount of the coil guide part recessed from the abutting face is set to be not less than an outer diameter of the conducting wire.

In the coil unit in accordance with at least an embodiment of the present invention, at least one side face structuring an outer peripheral face of the coil holding member is formed with a coil guide part for wiring a crossover wire so as to be recessed from the abutting face with the coil, and a recessed amount of the coil guide part from the abutting face is set to be not less than an outer diameter of the conducting wire. Therefore, according to at least an embodiment of the present invention, even when the coil wound around the protruded part of the side face where the coil guide part is formed and the crossover wire are disposed so as to be overlapped with each other in a protruding direction of the protruded part, the coil wound around the protruded part of the side face where the coil guide part is formed is prevented from riding on the crossover wire. Accordingly, in at least an embodiment of the present invention, the coil can be orderly wound around the protruded part.

In at least an embodiment of the present invention, for example, the outer peripheral face of the coil holding member is structured of two side-face pairs and, when each of the pair of the side faces structuring one of the two side-face pairs is referred to as a first side face, each of the pair of the side faces structuring the other of the two side-face pairs is referred to as a second side face, the coil wound around the protruded part of the first side face is referred to as a first coil, the coil wound around the protruded part of the second side face is referred to as a second coil, the crossover wire which serially connects two pieces of the first coil with each other is referred to as a first crossover wire, and the crossover wire which serially connects two pieces of the second coil with each other is referred to as a second crossover wire, the coil guide part for wiring the first crossover wire is formed in the second side face of at least one of a pair of the second side faces.

In this case, for example, the first crossover wire is wired so as to pass through the coil guide part which is formed in one of the pair of the second side faces, and the second crossover wire is wired along an outer peripheral face of one of the two pieces of the first coil. In this case, in the protruding direction of the protruded part around which the second coil is wound, even when one of the two second coils and the first crossover wire are disposed so as to be overlapped with each other, the second coil can be prevented from riding on the first crossover wire and, as a result, the second coil can be orderly wound around the protruded part of the second side face.

In at least an embodiment of the present invention, the coil guide part includes a coil guide groove in which a part of the first crossover wire is disposed, and the coil guide groove is formed along the protruded part of one of the pair of the second side faces. According to this structure, the first crossover wire is easily guided to the coil guide groove by utilizing the protruded part. Specifically, it may be structured that a shape of the outer peripheral face of the coil holding member when viewed in an axial direction of the coil holding member is formed in a substantially square tube shape, each of a pair of the first side faces and a pair of the second side faces is formed with the coil guide part structured to be capable of wiring the first crossover wire, the coil guide part includes a coil guide groove structured to be capable of disposing a part of the first crossover wire and the coil guide groove is formed along the protruded part which is formed in each of the pair of the first side faces and the pair of the second side faces.

In at least an embodiment of the present invention, the coil holding member is formed in a tube shape, at least one end side of the first side face in a circumferential direction of the coil holding member is formed with a guide part for guiding the second crossover wire from one side to the other side in an axial direction of the coil holding member formed in the tube shape, and at least one end side of the second side face in the circumferential direction of the coil holding member is formed with a guide part for guiding the first crossover wire from the one side to the other side in the axial direction of the coil holding member formed in the tube shape. According to this structure, even in a case that a winding direction of the first coil which is wound around to the protruded part of one of two first side faces is set to be reverse to a winding direction of the first coil wound around to the protruded part of the other of the two first side faces, and that a winding direction of the second coil which is wound around to the protruded part of one of two second side faces is set to be reverse to a winding direction of the second coil wound around to the protruded part of the other of the two second side faces, the crossover wire can be appropriately guided by utilizing the guide part.

In at least an embodiment of the present invention, the coil holding member is formed in a tube shape, the coil holding member is formed with four binding parts each of which is bound with an end part of the conducting wire, a shape of an outer peripheral face of the coil holding member when viewed in the axial direction of the coil holding member formed in the tube shape is a substantially rectangular shape, and each of the four binding parts is protruded from each of four corners of the outer peripheral face of the coil holding member to a direction perpendicular to the axial direction. According to this structure, for example, in comparison with a case that metal terminal pins around which end parts of a conducting wire are bound are inserted and fixed to the coil holding member, the number of components of the coil unit can be reduced and assembling process of the coil unit can be simplified. Further, according to this structure, in comparison with a case that a binding part is protruded to an axial direction of the coil holding member, a structure of a coil winding machine for winding a coil around the protruded part can be simplified.

In at least an embodiment of the present invention, an outward shape of a tip end of the binding part is set to be larger than an outward shape of a base end of the binding part, and the tip end side of the binding part is a coming-off prevention part structured to prevent coming-off of the end part of the conducting wire bound around the binding part to the tip end side of the binding part. According to this structure, coming-off of the end part of the conducting wire bound around the binding part to the tip end side from the binding part can be prevented.

In at least an embodiment of the present invention, the coil unit further includes a circuit board to which the end part of the conducting wire bound around the binding part is soldered and fixed and, when one side in the axial direction of the coil holding member is a first direction side, the circuit board is fixed to an end face on the first direction side, and the binding parts are formed on the first direction end side of the coil holding member. According to this structure, the end part of the conducting wire bound around the binding part can be directly soldered to a solder land formed on the circuit board.

In at least an embodiment of the present invention, for example, one of the binding parts functions as a guide for guiding the second crossover wire. In this case, the second crossover wire can be appropriately guided by utilizing the binding part.

The coil unit in accordance with an embodiment of the present invention may be used in a photographing optical device which includes a camera module which has a lens and an imaging element and is fixed to the coil holding member, a support body which swingably holds the coil unit, and a drive magnet which is fixed to the support body and is oppositely disposed to the coil. According to the photographing optical device, even when the coil wound around the protruded part of the side face where the coil guide part is formed and the crossover wire are disposed so as to be overlapped with each other in a protruding direction of the protruded part, the coil wound around the protruded part of the side face where the coil guide part is formed is prevented from riding on the crossover wire and the coil can be orderly wound around the protruded part.

Further, the coil unit in accordance with an embodiment of the present invention may be used in a photographing optical device which includes a camera module which has a lens and an imaging element and is fixed to the coil holding member, a support body which swingably holds the coil unit, and a drive magnet which is fixed to the support body and is oppositely disposed to the coil, and the coil holding member is provided with a restriction part which is disposed on the first direction side with respect to the coil and is structured to restrict a swing range of the camera module. In the photographing optical device, even when the coil wound around the protruded part of the side face where the coil guide part is formed and the crossover wire are disposed so as to be overlapped with each other in a protruding direction of the protruded part, the coil wound around the protruded part of the side face where the coil guide part is formed is prevented from riding on the crossover wire and the coil can be orderly wound around the protruded part. Further, in the photographing optical device, the restriction part which restricts a swing range of the camera module is disposed on the first direction side with respect to the coil and thus, even in a case that four binding parts are protruded from four corners of an outer peripheral face of the coil holding member to a direction perpendicular to the axial direction and that end parts of a conducting wire bound around the binding parts are soldered to the circuit board at four corners of the coil holding member, a swing range of the camera module can be restricted by the restriction part disposed on the first direction side with respect to the coil.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 1 is a perspective view showing a photographing optical device in accordance with an embodiment of the present invention.

DETAILED DESCRIPTION

Embodiments of the present invention will be described below with reference to the accompanying drawings.

(Entire Structure of Photographing Optical Device)

Figure 2:
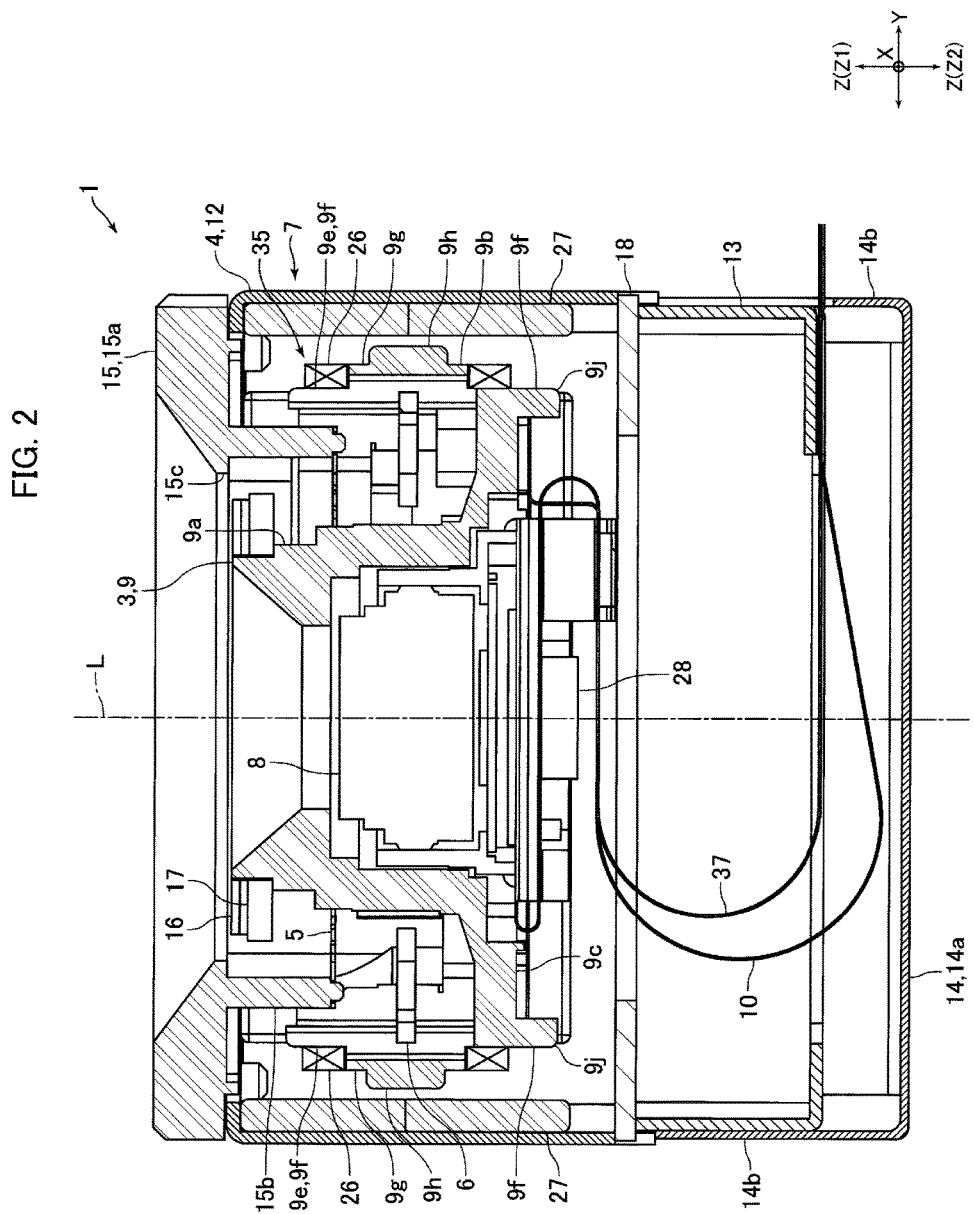
FIG. 2 is a cross-sectional view showing the "E-E" cross section in FIG. 1.
Figure 3:
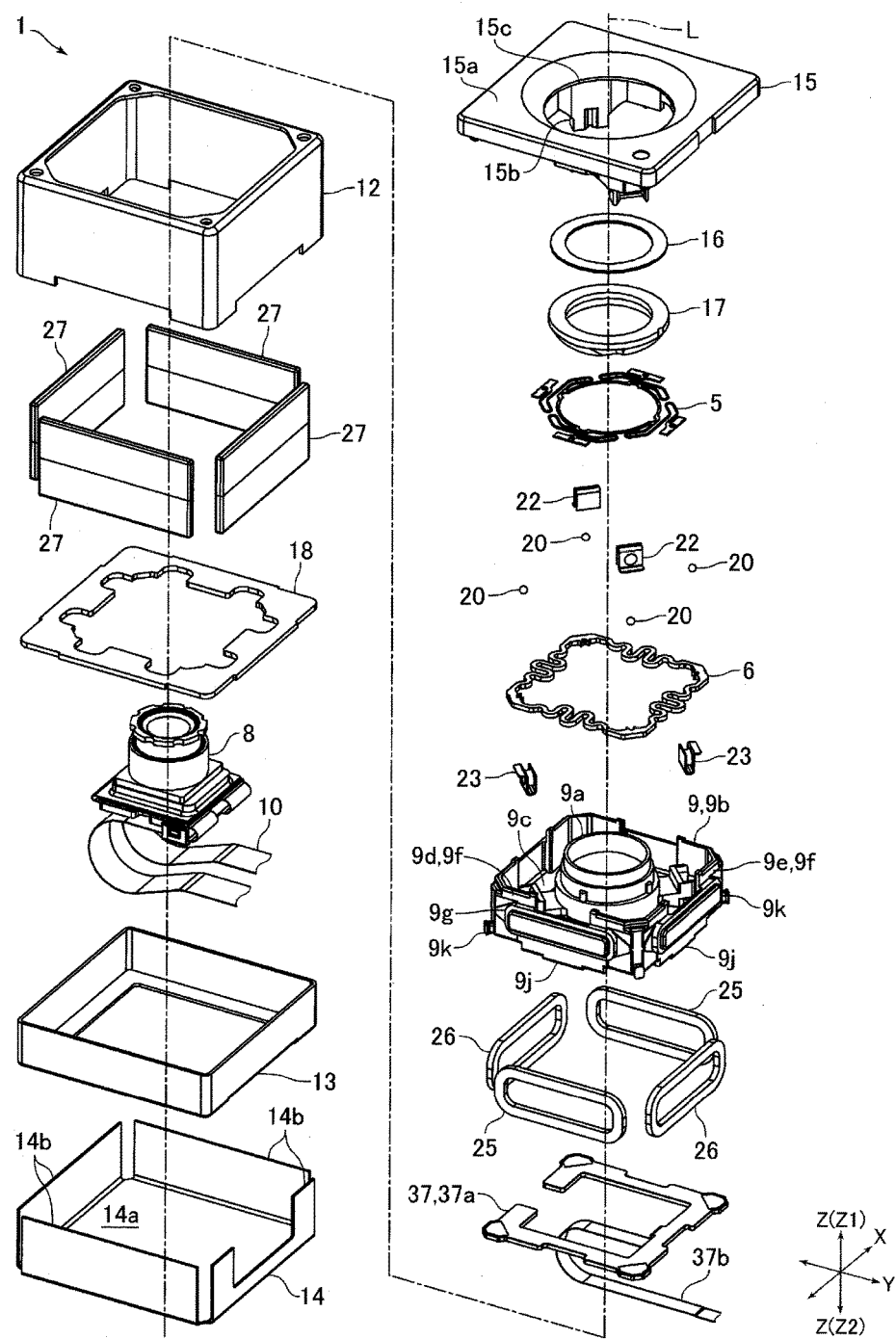
FIG. 3 is an exploded perspective view showing the photographing optical device in FIG. 1.

FIG. 1 is a perspective view showing a photographing optical device 1 in accordance with an embodiment of the present invention. FIG. 2 is a cross-sectional view showing the "E-E" cross section in FIG. 1. FIG. 3 is an exploded perspective view showing the photographing optical device 1 in FIG. 1. In the following descriptions, as shown in FIG. 1 and the like, respective three directions perpendicular to each other are set as an "X" direction, a "Y" direction and a "Z" direction, and the "X" direction is referred to as a right and left direction, the "Y" direction is referred to as a front and rear direction, and the "Z" direction is referred to as an upper and lower direction. Further, the "Z1" direction side in FIG. 1 and the like is referred to as an "upper" side and the "Z2" direction side is referred to as a "lower" side.

A photographing optical device 1 in this embodiment is a small and thin camera which is mounted on a portable apparatus such as a cell phone, a drive recorder, a monitor camera system, an action camera mounted on a helmet, a bicycle, a radio-controlled helicopter and the like or a wearable camera or the like. The photographing optical device 1 is provided with a shake correction function for preventing a disturbance in a photographed image when a shake is occurred at the time of photographing. The photographing optical device 1 is formed in a substantially rectangular parallelepiped shape as a whole. In this embodiment, the photographing optical device 1 is formed in a substantially square shape when viewed in a direction of an optical axis "L" (optical axis direction) of a lens for photographing. Four side faces of the photographing optical device 1 are substantially parallel to the "Z-X" plane structured of the right and left direction and the upper and lower direction or substantially parallel to the "Y-Z" plane structured of the front and rear direction and the upper and lower direction.

The photographing optical device 1 includes a movable module 3 on which a lens for photographing and an imaging element are mounted, a support body 4 which swingably holds the movable module 3, a spring member 5 which connects the movable module 3 with the support body 4, and a movable frame 6. Further, the photographing optical device 1 includes a shake correction mechanism 7 structured to swing the movable module 3 with respect to the support body 4 to correct a shake such as a shake at the time of photographing (see FIG. 2). In this embodiment, the upper and lower direction is substantially coincided with an optical axis direction of the movable module 3 when the movable module 3 is not swung. Further, in this embodiment, an imaging element is mounted on a lower end side of the movable module 3 and an object to be photographed which is located on an upper side is photographed.

The movable module 3 is formed in a substantially quadrangular prism shape whose shape when viewed in the optical axis direction is a substantially square shape as a whole. The movable module 3 includes a camera module 8 having a lens and an imaging element, and a holder 9 to which the camera module 8 is fixed. The camera module 8 includes, for example, a movable body which holds the lens and is movable in the optical axis direction, a holding body which movably holds the movable body in the optical axis direction, a plate spring which connects the movable body with the holding body, and a lens drive mechanism structured to drive the movable body in the optical axis direction. In other words, the camera module 8 includes an autofocus mechanism. A flexible printed circuit board 10 is extended from a lower end side of the camera module 8. In accordance with an embodiment of the present invention, the camera module 8 may include no autofocus mechanism.

The holder 9 is formed of resin material having heat resistance and insulation property. The holder 9 is formed in a tube shape and is disposed so that an axial direction of the holder 9 formed in a tube shape and the optical axis direction are coincided with each other. A shape of an outer peripheral face of the holder 9 when viewed in the axial direction of the holder 9 (in the optical axis direction) is a substantially rectangular shape. Specifically, a shape of an outer peripheral face of the holder 9 when viewed in the optical axis direction is a substantially square shape. The camera module 8 is fixed to an inner peripheral side of the holder 9 so that an outer peripheral side of the camera module 8 is covered by the holder 9. Weights 16 and 17 for adjusting balance of the movable module 3 are fixed to an upper end side of the holder 9. The holder 9 in this embodiment is a coil holding member which holds shake correction coils 25 and 26 described below structuring the shake correction mechanism 7.

The support body 4 includes a case body 12 which structures four side faces on front and rear sides and right and left sides of an upper end side portion of the support body 4, a lower case body 13 and a cover member 14 which structure a lower end side portion of the support body 4, and a cover member 15 which structures an upper end face of the support body 4. In this embodiment, the case body 12 structures four side faces on front and rear sides and right and left sides of an upper end side portion of the photographing optical device 1, and the lower case body 13 and the cover member 14 structure a lower end side portion of the photographing optical device 1, and the cover member 15 structures an upper end face of the photographing optical device 1.

The case body 12 is formed in a substantially rectangular tube shape. The case body 12 is disposed so as to cover the movable module 3 and the shake correction mechanism 7 from an outer peripheral side. The cover member 15 is fixed to an upper end face of the case body 12. The cover member 15 is structured of an upper face part 15a formed in a substantially square flat plate shape and a protruded part 15b protruded from an under face of the upper face part 15a to a lower side. A circular through-hole 15c is formed at a center of the upper face part 15a. The protruded part 15b is formed in a substantially square frame shape and is protruded from an edge of the through-hole 15c to a lower side. The lower case body 13 is formed in a substantially rectangular tube shape. The cover member 14 is structured of a bottom face part 14a covering a lower end of the lower case body 13 and four side face parts 14b covering an outer peripheral side of the lower case body 13. A stopper 18 for restricting a swing range of the movable module 3 is fixed between a lower end of the case body 12 and an upper end of the lower case body 13.

A spring member 5 is a plate spring and is formed in a flat plate shape. The spring member 5 is provided with a movable side fixed part which is fixed to an upper end side of the movable module 3 (specifically, fixed to an upper end side of the holder 9), a support side fixed part which is fixed to an upper end side of the support body 4 (specifically, fixed to the protruded parts 15b of the cover member 15), and a plurality of arm parts which connect the movable side fixed part with the support side fixed part. The spring member 5 functions to maintain a posture of the movable module 3 when an electric current is not supplied to shake correction coils 25 and 26 described below which structure the shake correction mechanism 7.

The movable frame 6 is an elastic member and is formed in a plate shape as a whole and in a substantially square frame shape. The movable frame 6 is disposed so that its four sides are substantially parallel to the front and rear direction or the right and left direction. A center part of each of the sides of the movable frame 6 which is formed in a substantially square frame shape is formed with a meandering part which meanders with respect to the front and rear direction or the right and left direction. A spherical body 20 formed in a spherical shape is fixed to each of inner sides of four corners of the movable frame 6. The spherical body 20 is formed of metal material and is joined to the movable frame 6 by laser welding.

Among four spherical bodies 20, two spherical bodies 20 which are disposed on one diagonal line of the movable frame 6 are supported by a support member 22 which turnably supports the spherical body 20, and two remaining spherical bodies 20 are supported by a support member 23 which turnably supports the spherical body 20. The support members 22 and 23 are plate springs which are formed by bending a thin metal plate in a predetermined shape. The support member 22 is fixed to a lower end side of the protruded part 15b of the cover member 15. The support member 23 is fixed to an upper end side of the holder 9.

The support members 22 and 23 are formed with a recessed part in a hemispheric shape in which a part of the spherical body 20 is disposed. The support members 22 and 23 hold the spherical body 20 from an inner peripheral side of the movable frame 6. In this embodiment, a gimbal mechanism is structured between the movable module 3 and the support body 4, and the movable module 3 is swingably supported by the support members 22 around a first axial line and is swingably supported by the support members 23 around a second axial line with respect to the support body 4 through the movable frame 6 used in the gimbal mechanism.

The shake correction mechanism 7 includes shake correction coils 25 and 26 as coils which are respectively fixed to four side faces of the holder 9 and shake correction magnets 27 as drive magnets which are respectively fixed to four inner side faces of the case body 12. In other words, the shake correction mechanism 7 includes four shake correction coils 25 and 26 and four shake correction magnets 27. The shake correction magnets 27 are formed in a rectangular flat plate shape and are fixed to an inner side face of the case body 12 so as to face the shake correction coils 25 and 26.

The shake correction coils 25 and 26 are formed by winding a conducting wire in a substantially rectangular frame shape. In other words, the shake correction coils 25 and 26 are formed in a substantially rectangular frame shape. The shake correction coil 25 and the shake correction coil 26 are formed in the same shape as each other. In this embodiment, a coil unit 35 (see FIG. 4) is structured of the holder 9, four shake correction coils 25 and 26, and a flexible printed circuit board 37 described below. The coil unit 35 is swingably held by the support body 4. A detailed structure of the coil unit 35 will be described below.

In the photographing optical device 1 structured as described above, when a variation of inclination of the movable module 3 is detected by a gyroscope 28 (see FIG. 2) which is attached to a lower end face of the movable module 3, electric currents are supplied to the shake correction coils 25 and 26 based on a detected result by the gyroscope 28. Further, when electric currents are supplied to the shake correction coils 25 and 26, the movable module 3 is swung around the first axial line supported by the support members 22 and is swung around the second axial line supported by the support members 23 with respect to the support body 4 through the movable frame 6 used in the gimbal mechanism and thereby the shake is corrected.

(Structure of Coil Unit)

Figure 4:
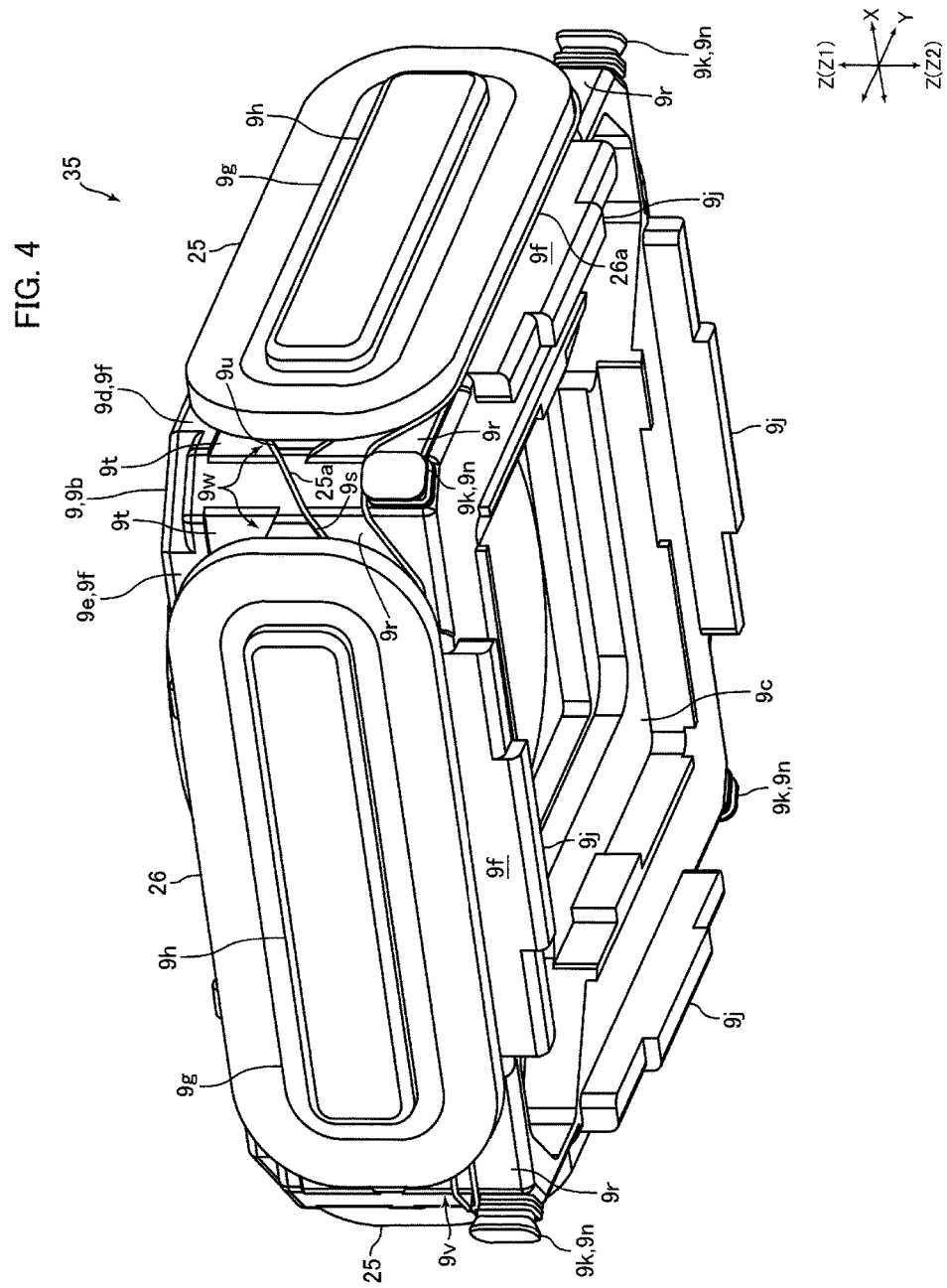
FIG. 4 is a perspective view showing a coil unit in accordance with an embodiment of the present invention.
Figure 5:
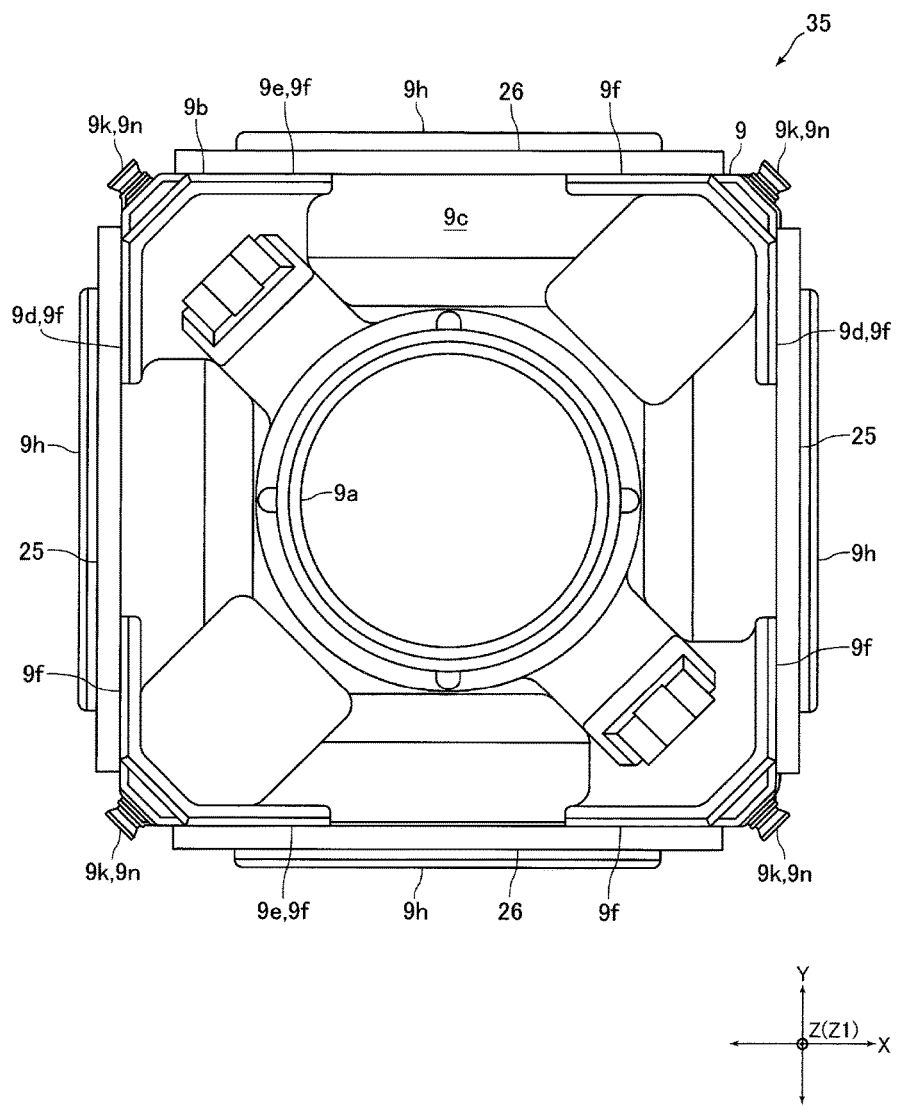
FIG. 5 is a plan view showing the coil unit in FIG. 4.
Figure 6:
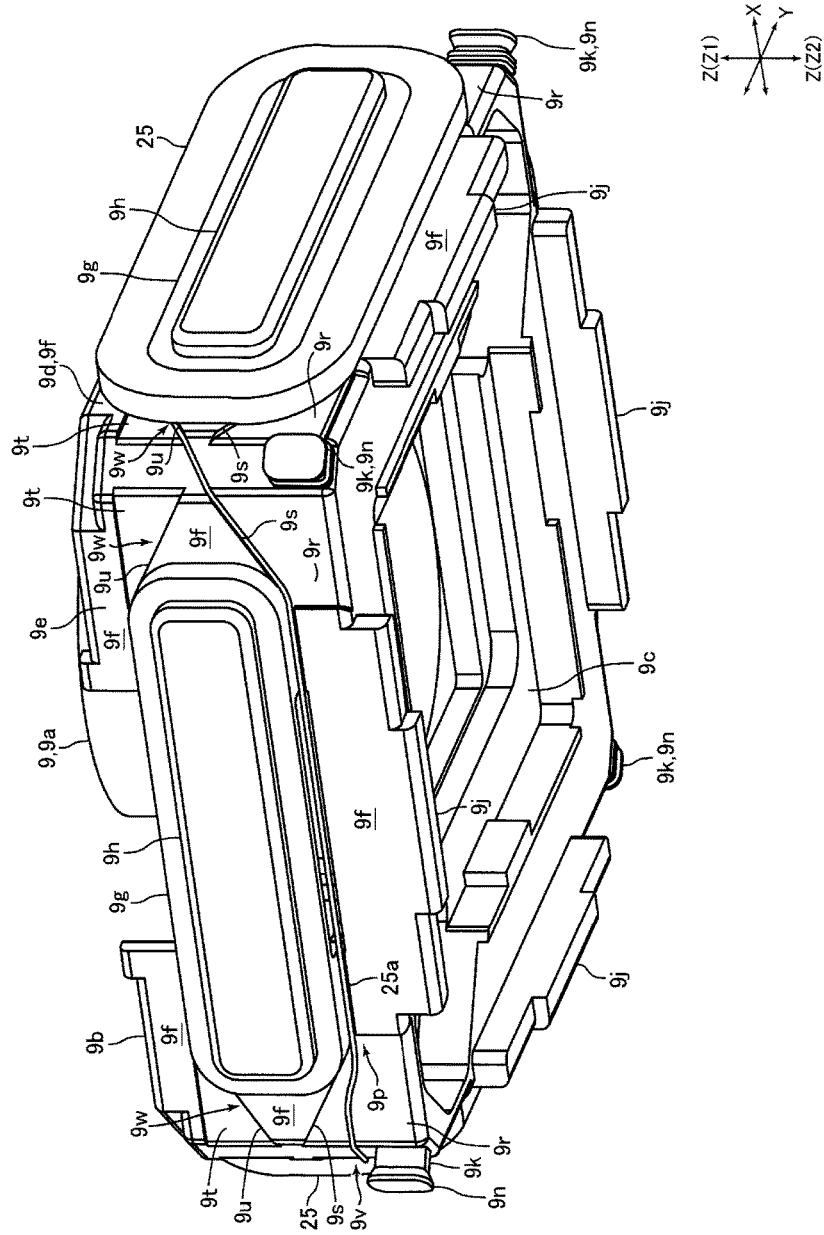
FIG. 6 is a perspective view showing a state that a second coil is detached from the coil unit shown in FIG. 4.
Figure 7:
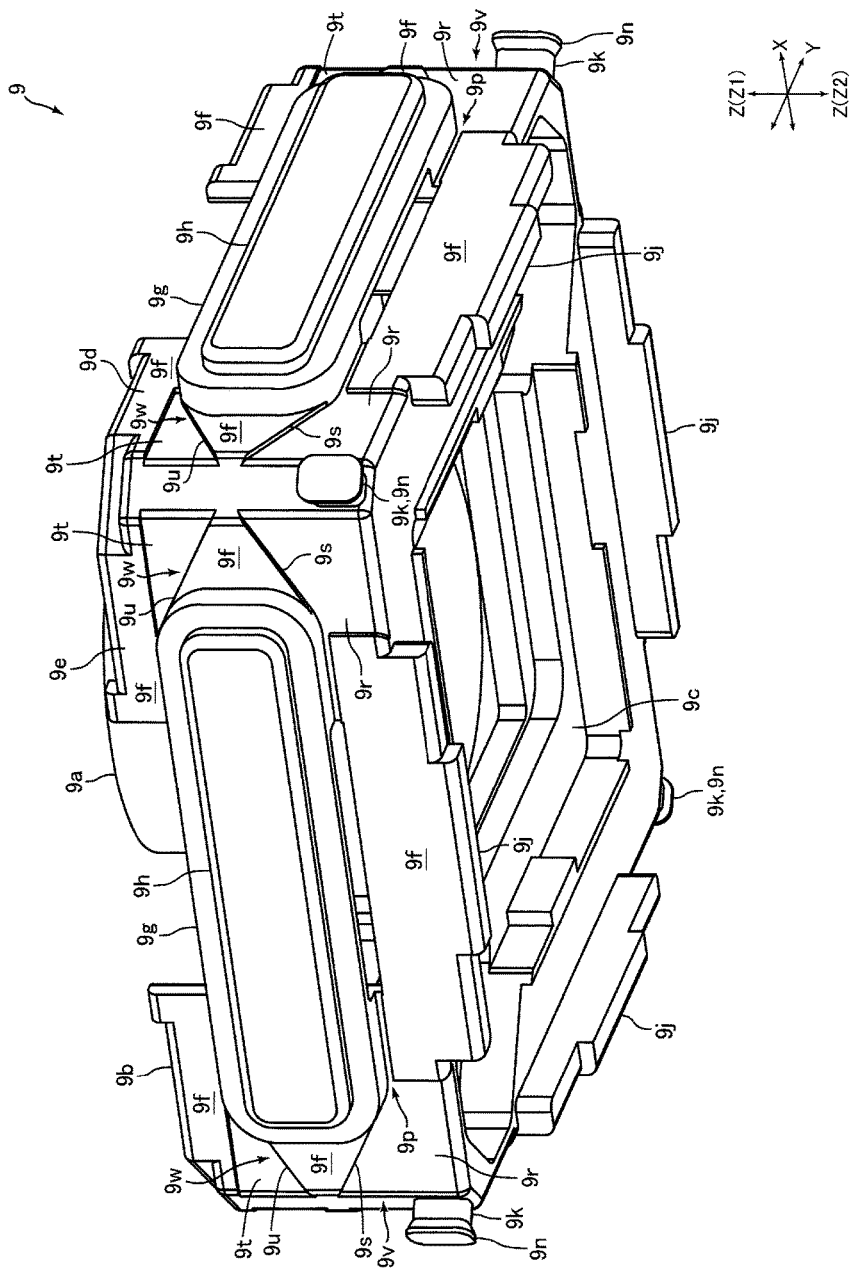
FIG. 7 is a perspective view showing a holder in FIG. 4.

FIG. 4 is a perspective view showing the coil unit 35 in accordance with an embodiment of the present invention. FIG. 5 is a plan view showing the coil unit 35 in FIG. 4. FIG. 6 is a perspective view showing a state that the shake correction coils 26 are detached from the coil unit 35 shown in FIG. 4. FIG. 7 is a perspective view showing the holder 9 in FIG. 4.

The coil unit 35 includes the holder 9, two shake correction coils 25 and two shake correction coils 26. Further, the coil unit 35 includes the flexible printed circuit board 37 as a circuit board (see FIG. 3) with which end parts of the shake correction coils 25 and 26 are electrically connected and which is structured to supply an electric current to the shake correction coils 25 and 26. As described above, the shake correction coils 25 and 26 are formed in a substantially rectangular frame shape and are structured of two long side parts and two short side parts shorter than the long side part. In FIGS. 4 and 5, the flexible printed circuit board 37 is not shown.

The holder 9 is formed in a substantially tube shape as described above. Specifically, the holder 9 is formed in a double tube shape which is structured of an inner tube part 9a formed in a substantially cylindrical tube shape, an outer tube part 9b which is formed in a substantially rectangular tube shape and is disposed to an outer peripheral side of the inner tube part 9a, and a bottom part 9c which connects a lower end of the inner tube part 9a and a lower end of the outer tube part 9b. The camera module 8 is fixed to an inner peripheral side of the inner tube part 9a. As described above, an outer peripheral face of the holder 9 (specifically, outer peripheral face of the outer tube part 9b) when viewed in the optical axis direction is formed in a substantially square shape. The outer peripheral face of the holder 9 is formed of two side faces 9d substantially perpendicular to the right and left direction and parallel to each other and two side faces 9e substantially perpendicular to the front and rear direction and parallel to each other.

In other words, the outer peripheral face of the holder 9 is formed of side-face pairs comprised of a pair of the side faces 9d parallel to each other and a side-face pair comprised of a pair of the side faces 9e parallel to each other. The outer peripheral face of the holder 9 is structured of two side-face pairs. The two side-face pairs are disposed so as to be perpendicular to each other. The side face 9d in this embodiment is a first side face structuring one side-face pair of the two side-face pairs and the side face 9e is a second side face structuring the other side-face pair. A shape of an outer peripheral face of the holder 9, which is the coil holding member, when viewed in an axial direction of the holder 9 is formed in a substantially square tube shape comprised of the first side faces and the second side faces.

The side face 9d is formed with a protruded part 9g so as to protrude to an outer peripheral side of the holder 9 and one shake correction coil 25 is directly wound around the protruded part 9g. The side face 9e is, similarly, formed with a protruded part 9g so as to protrude to an outer peripheral side of the holder 9 and the shake correction coil 26 is directly wound around the protruded part 9g. In other words, the side face 9d is formed with the protruded part 9g protruding to an outer side in the right and left direction, and the side face 9e is formed with the protruded part 9g protruding to an outer side in the front and rear direction. The protruded part 9g formed in the side face 9d and the protruded part 9g formed in the side face 9e are formed in the same shape as each other. The shake correction coil 25 in this embodiment is a first coil which is wound around the protruded part 9g of the side face 9d that is the first side face, and the shake correction coil 26 is a second coil which is wound around the protruded part 9g of the side face 9e that is the second side face.

The protruded part 9g formed on the side face 9d (first side face) is formed so that its shape when viewed in the right and left direction is a substantially rectangular shape (specifically, a substantially rectangular shape whose four corners are rounded) in which the front and rear direction is its longitudinal direction and the upper and lower direction is its short-side direction. The protruded part 9g formed on the side face 9e (second side face) is formed so that its shape when viewed in the front and rear direction is a substantially rectangular shape (specifically, a substantially rectangular shape whose four corners are rounded) in which the right and left direction is its longitudinal direction and the upper and lower direction is its short-side direction. A thickness of the protruded part 9g (protruding amounts of the protruded parts 9g from the side faces 9d and 9e) is set to be equal to the thicknesses of the shake correction coils 25 and 26. In this embodiment, a tip end protruded part 9h further protruding to the outer side of the holder 9 is formed on a tip end side of the protruded part 9g in the protruding direction of the protruded part 9g.

The side face 9d is formed with an abutting face 9f in a flat face shape with which one end face (inner end face) of the shake correction coil 25 wound around the protruded part 9g is abutted. The side face 9e is, similarly, formed with an abutting face 9f in a flat face shape with which one end face (inner end face) of the shake correction coil 26 wound around the protruded part 9g is abutted. Specifically, when directions perpendicular to the directions parallel to the long sides of the shake correction coils 25 and 26 formed in a substantially rectangular frame shape and perpendicular to the directions parallel to the short sides of the shake correction coils 25 and 26 are referred to as thickness directions of the shake correction coils 25 and 26, the respective side faces 9d and 9e are formed with abutting faces 9f with which the one end faces (inner end faces) in the thickness direction of the shake correction coils 25 and 26 are abutted.

The abutting face 9f is formed at five positions in each of the side faces 9d and 9e. Specifically, as shown in FIG. 7, in each of the side faces 9d and 9e, the abutting face 9f is formed at totaled five positions, i.e., two positions on an upper side of the protruded part 9g, two positions on both sides of the protruded part 9g in a circumferential direction of the holder 9, and one position on a lower side of the protruded part 9g. The abutting face 9f formed in the side face 9d is formed in a flat face shape perpendicular to the right and left direction, and the abutting face 9f formed in the side face 9e is formed in a flat face shape perpendicular to the front and rear direction. In this embodiment, only the protruded part 9g is protruded to an outer side of the holder 9 with respect to the abutting face 9f so that the shake correction coils 25 and 26 are directly wound around the protruded parts 9g on the side faces 9d and 9e. In the following descriptions, a circumferential direction of the holder 9 formed in a tube shape is referred to as a "circumferential direction".

The shake correction coil 25 is wound around a side face of the protruded part 9g of the side face 9d and the shake correction coil 26 is wound around a side face of the protruded part 9g of the side face 9e. The shake correction coils 25 and 26 are, for example, wound around the side faces of the respective protruded parts 9g by alignment winding. Further, the shake correction coils 25 and 26 are wound around the respective protruded parts 9g so that the short side directions of the shake correction coils 25 and 26 and the upper and lower direction are coincided with each other. Inner peripheral faces of the shake correction coils 25 and 26 are contacted with the side faces of the respective protruded parts 9g over the entire periphery. Specifically, the inner peripheral faces of the shake correction coils 25 and 26 are closely contacted with the side faces of the respective protruded parts 9g over the entire periphery.

When viewed from one side in the right and left direction, a winding direction of the shake correction coil 25 wound around the protruded part 9g of one of two side faces 9d is the same as a winding direction of the shake correction coil 25 wound around the protruded part 9g of the other of the two side faces 9d. Similarly, when viewed from one side in the front and rear direction, a winding direction of the shake correction coil 26 wound around the protruded part 9g of one of two side faces 9e is the same as a winding direction of the shake correction coil 26 wound around the protruded part 9g of the other of the two side faces 9e.

Two shake correction coils 25 wound around the respective protruded parts 9g of the two side faces 9d are structured of one conducting wire, and two shake correction coils 26 wound around the respective protruded parts 9g of the two side faces 9e are structured of one conducting wire. In other words, the two shake correction coils 25 are structured of one continuous conducting wire, and the two shake correction coils 26 are structured of one continuous conducting wire. Further, the two shake correction coils 25 are serially-connected with each other through a crossover wire 25a, and the two shake correction coils 26 are serially-connected with each other through a crossover wire 26a (see FIG. 4). In this embodiment, the crossover wire 25a is a first crossover wire and the crossover wire 26a is a second crossover wire.

The holder 9 is formed with restriction parts 9j structured to restrict a swing range of the movable module 3 (in other words, restrict a swing range of the camera module 8). The restriction part 9j is formed at four positions of the holder 9. Further, the restriction parts 9j are respectively formed on lower sides with respect to the four protruded parts 9g so as to protrude to a lower side from the abutting face 9f and are disposed on lower sides with respect to the shake correction coils 25 and 26. Further, the restriction part 9j is formed at a center position of the side face 9d in the front and rear direction and at a center position of the side face 9e in the right and left direction. The restriction part 9j is protruded to a lower side with respect to a lower side end face of the holder 9 and structures a lower end face of the outer tube part 9b formed in a substantially rectangular tube shape. In this embodiment, the swing range of the movable module 3 is restricted by a lower end of the restriction part 9j contacting with the stopper 18.

The holder 9 is formed with totaled four binding parts 9k, in other words, two binding parts 9k around which end parts of a conducting wire structuring the shake correction coils 25 are bound, and two binding parts 9k around which end parts of a conducting wire structuring the shake correction coils 26 are bound. The binding part 9k is formed in a projected shape. Each of the four binding parts 9k is, as shown in FIG. 5, protruded to a direction perpendicular to the upper and lower direction (in other words, toward an outer side of the holder 9) from each of four corners of the holder 9 (in other words, from each of four corners of the outer tube part 9b formed in a substantially square shape) when viewed in the upper and lower direction. Specifically, the binding part 9k is protruded toward an outer side in a radial direction of a lens of the camera module 8 and, in addition, in a direction inclined by 45° with respect to the front and rear direction and the right and left direction. Further, the four binding parts 9k are provided so as not to protrude to an outer side from a square formed by the outer end faces of two shake correction coils 25 and the outer end faces of two shake correction coils 26, in other words, so as to be located substantially on an inner side of the square formed by the outer end faces of two shake correction coils 25 and the outer end faces of two shake correction coils 26. Further, the binding part 9k is formed on a lower end side of the holder 9. The lower direction ("Z2" direction) in this embodiment is a first direction which is one side in the axial direction of the holder 9 formed in a tube shape.

In this embodiment, an end part on a winding-start side of one conducting wire structuring two shake correction coils 25 is wound and bound to the binding part 9k disposed on a left rear side (the binding part 9k disposed on a left upper side in FIG. 5), and an end part on a winding-end side of the conducting wire is wound and bound to the binding part 9k disposed on a right front side (the binding part 9k disposed on a right lower side in FIG. 5). Further, an end part on a winding-start side of one conducting wire structuring two shake correction coils 26 is wound and bound to the binding part 9k disposed on a left front side (the binding part 9k disposed on a left lower side in FIG. 5), and an end part on a winding-end side of the conducting wire is wound and bound to the binding part 9k disposed on a right rear side (the binding part 9k disposed on a right upper side in FIG. 5). In other words, two binding parts 9k located at diagonal positions of the substantially square-shaped outer tube part 9b are the binding parts 9k around which an end part on the winding-start side and an end part on the winding-end side for two shake correction coils 25 are bound, and the remaining two binding parts 9k located at diagonal positions of the outer tube part 9b are the binding parts 9k around which an end part on the winding-start side and an end part on the winding-end side for two shake correction coils 26 are bound.

An outward shape of a tip end of the binding part 9k is set to be larger than an outward shape of a base end of the binding part 9k. The tip end side of the binding part 9k is structured to be a coming-off prevention part 9n for preventing an end part of the conducting wire bound to the binding part 9k from coming off to the tip end side of the binding part 9k. The coming-off prevention part 9n is formed with a taper part in a taper shape whose outward shape becomes gradually smaller as going from the tip end of the binding part 9k toward its base end.

As shown in FIG. 7, coil guide grooves 9p for disposing parts of the crossover wires 25a and 26a are formed between the protruded part 9g and the abutting face 9f formed on a lower side of the protruded part 9g of the respective side faces 9d and 9e. The coil guide groove 9p is formed so as to be recessed from the abutting face 9f. Further, the coil guide groove 9p is formed along the side face on the lower side of the protruded part 9g. In other words, the coil guide groove 9p formed in the side face 9d on which the shake correction coil 25 is wound is recessed to an inner side in the right and left direction so that the groove is long and thin in the front and rear direction, and the coil guide groove 9p formed in the side face 9e on which the shake correction coil 26 is wound is recessed to an inner side in the front and rear direction so that the groove is long and thin in the right and left direction. Further, the side face on the lower side of the protruded part 9g serves as a side face on an upper side of the coil guide groove 9p.

A recessed amount of the coil guide groove 9p from the abutting face 9f is set to be not less than an outer diameter of a conducting wire structuring the shake correction coils 25 and 26. In this embodiment, the recessed amount of the coil guide groove 9p from the abutting face 9f is set to be substantially equal to an outer diameter of the conducting wire. Further, a width of the coil guide groove 9p (width in the upper and lower direction) is set to be not less than the outer diameter of the conducting wire. In this embodiment, the width of the coil guide groove 9p is set to be substantially equal to the outer diameter of the conducting wire.

Recessed parts 9r which are recessed from the abutting face 9f are formed on both sides in a circumferential direction of the coil guide groove 9p in each of the side faces 9d and 9e. In other words, in the side face 9d, the recessed parts 9r are formed on both sides in the front and rear direction of the coil guide groove 9p and, in the side face 9e, the recessed parts 9r are formed on both sides in the right and left direction of the coil guide groove 9p. Further, the recessed parts 9r are formed on both sides in the circumferential direction of the abutting face 9f disposed on the lower side of the protruded part 9g and are formed on lower sides of the abutting faces 9f disposed on both sides in the circumferential direction of the protruded part 9g. Both ends of the coil guide groove 9p are communicated and connected with the recessed part 9r.

A recessed amount of the recessed part 9r from the abutting face 9f is set to be not less than the outer diameter of the conducting wire structuring the shake correction coils 25 and 26. Specifically, the recessed amount of the recessed part 9r from the abutting face 9f is equal to the recessed amount of the coil guide groove 9p from the abutting face 9f. A side face on an upper side of the recessed part 9r (in other words, a step face between the recessed part 9r and the abutting face 9f which is disposed on both sides in the circumferential direction of the protruded part 9g) is an inclined face 9s which is inclined toward an upper side as going to an outer side in the circumferential direction with respect to the protruded part 9g. The inclined face 9s is formed from the protruded part 9g so as to be continuously connected with the coil guide groove 9p and, for example, formed so as to be capable of guiding the crossover wire 25a guided by the coil guide groove 9p to an upper side along the inclined face 9s.

In the side faces 9d and 9e, a recessed part 9t which is recessed from the abutting face 9f is formed on an upper side of each of the abutting faces 9f disposed on both sides in the circumferential direction of the protruded part 9g. In other words, the recessed part 9t which is recessed from the abutting face 9f is formed on both end sides in the front and rear direction of the side face 9d and on both end sides in the right and left direction of the side face 9e. The recessed part 9t is formed on a lower side of the abutting face 9f which is disposed on an upper side of the protruded part 9g. A recessed amount of the recessed part 9t from the abutting face 9f is set to be equal to the recessed amount of the recessed part 9r from the abutting face 9f.

A side face on a lower side of the recessed part 9t (in other words, a step face between the recessed part 9t and the abutting face 9f which is disposed on both sides in the circumferential direction of the protruded part 9g) is an inclined face 9u which is inclined toward a lower side as going to an outer side in the circumferential direction with respect to the protruded part 9g. An inclination angle of the inclined face 9u is set to be substantially equal to an inclination angle of the inclined face 9s. Further, the inclined face 9u which is formed in the side face 9d is disposed substantially on an extended line of the inclined face 9s formed in the side face 9e in the circumferential direction, and the inclined face 9u which is formed in the side face 9e is disposed substantially on an extended line of the inclined face 9s formed in the side face 9d in the circumferential direction. The inclined face 9u is formed so as to be connected with a boundary portion between the protruded part 9g and the abutting face 9f and, when a conducting wire is to be guided by the inclined face 9u, the conducting wire is guided so as to be abutted with an upper side face of the protruded part 9g.

In this embodiment, the coil guide groove 9p and two recessed parts 9r which are formed in the side face 9d or the side face 9e structure coil guide parts 9v for extending the crossover wires 25a and 26a. In other words, the side faces 9d and 9e are formed with the coil guide parts 9v for extending the crossover wires 25a and 26a so that the coil guide part 9v is recessed from the abutting face 9f and a recessed amount of the coil guide part 9v from the abutting face 9f is set to be not less than the outer diameter of the conducting wire.

In this embodiment, the guide part 9w for guiding the crossover wires 25a and 26a from a lower side to an upper side (or from an upper side to a lower side) is structured of the inclined face 9s and the inclined face 9u which are disposed so as to sandwich one of the abutting faces 9f in the upper and lower direction, the abutting face 9f being disposed on both sides of the protruded part 9g in the circumferential direction. In other words, the guide part 9w is formed on both end sides of the side faces 9d and 9e in the circumferential direction. As described above, the winding directions of the two shake correction coils 25 are the same as each other and thus, in a case that the crossover wire 25a is to be wired between the two shake correction coils 25, for example, the crossover wire 25a is required to be wired from a lower side to an upper side. Therefore, the crossover wire 25a having passed through the coil guide groove 9p formed in the side face 9e is wired to an upper side along the inclined face 9s formed in the side face 9e and then, the crossover wire 25a is guided by the inclined face 9u formed in the side face 9d to reach the upper side face of the protruded part 9g of the side face 9d and the shake correction coil 25 is wound around the protruded part 9g of the side face 9d and, as a result, the winding directions of the two shake correction coils 25 are set to be the same as each other.

The flexible printed circuit board 37 is provided with a fixed part 37a which is fixed to an end face on a lower side of the holder 9 and an extended part 37b which is extended from the fixed part 37a (see FIG. 3). The fixed part 37a is, for example, fixed to the end face on the lower side of the holder 9 by an adhesive. An upper face of the fixed part 37a is formed with solder lands to which the end parts of conducting wires of the shake correction coils 25 and 26 are soldered and fixed. The end parts of the conducting wires are bound around the binding parts 9k. The solder land is formed at four positions. Respective four solder lands are directly soldered with an end part on a winding-start side of a conducting wire for the shake correction coil 25, an end part of the winding-end side of the conducting wire, an end part on a winding-start side of the conducting wire for the shake correction coil 26, and an end part on the winding-end side of the conducting wire. In this embodiment, the end parts of the conducting wire for the shake correction coils 25 and 26 which are bound around the binding parts 9k are soldered to the solder lands by using soldering paste which is applied to the solder lands.

(Winding Method of Shake Correction Coil)

Figure 8:
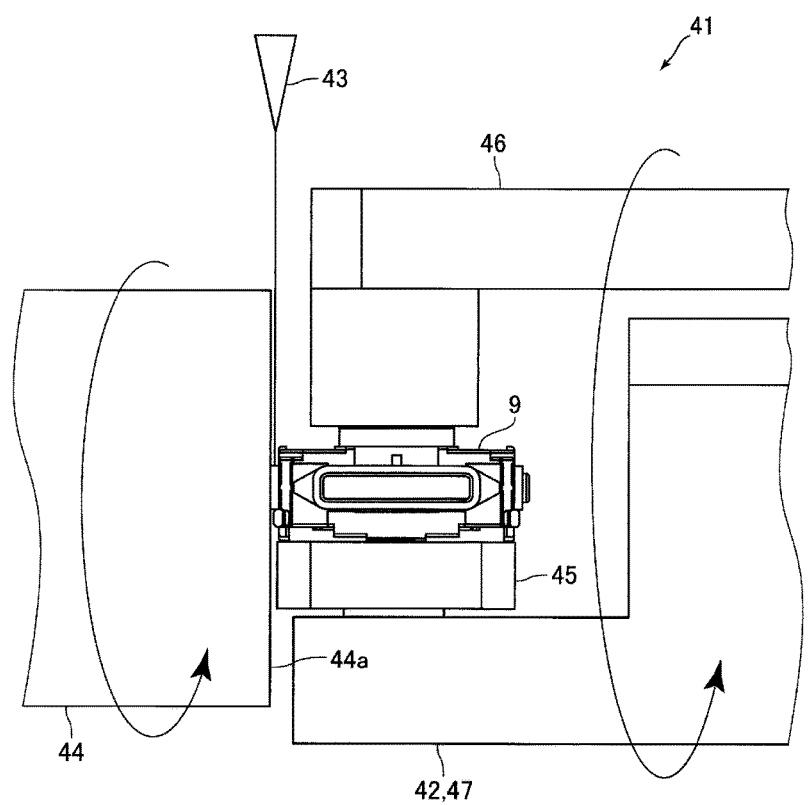
FIG. 8 is a schematic view showing a winding device structured to wind a coil to the holder shown in FIG. 4.

FIG. 8 is a schematic view showing a winding device 41 structured to wind the shake correction coils 25 and 26a to the holder 9 shown in FIG. 4. In the following descriptions, a clockwise turning direction in FIG. 5 is referred to as a "clockwise direction", and a counterclockwise turning direction in FIG. 5 is referred to as a "counterclockwise direction".

Winding of the shake correction coils 25 and 26 around the protruded parts 9g of the holder 9 is performed by using a winding device 41. As shown in FIG. 8, the winding device 41 includes a main body part 42 to which the holder 9 is fixed, a rotation mechanism (not shown) structured to rotate the main body part 42, a supply nozzle 43 structured to supply a conducting wire, and a subordinate head 44 which is rotatable together with the main body part 42. The main body part 42 includes a holder mounting part 45 on which the holder 9 is mounted, a clamp part 46 structured to sandwich the holder 9 together with the holder mounting part 45 and fix the holder 9, and a base part 47 which turnably holds the holder mounting part 45 with the upper and lower direction in FIG. 8 as an axial direction of turning and movably holds the clamp part 46 so that the clamp part 46 is capable of being moved in the upper and lower direction in FIG. 8. The main body part 42 can be rotated with the right and left direction in FIG. 8 as an axial direction of rotation.

The subordinate head 44 is linearly movable in the right and left direction in FIG. 8. Further, the subordinate head 44 can be rotated with the right and left direction in FIG. 8 as an axial direction of rotation. The subordinate head 44 is connected with a rotation mechanism structured to rotate the subordinate head 44, and the main body part 42 and the subordinate head 44 are rotated with each other synchronously. Further, the subordinate head 44 is formed with a contact face 44a in a flat face shape configured to contact with a tip end face of the protruded part 9g of the holder 9. The contact face 44a is formed with a recessed part into which the tip end protruded part 9h is entered.

When the shake correction coils 25 and 26 are to be wound around the protruded parts 9g by the winding device 41, first, the holder 9 is mounted on the holder mounting part 45 and, after the holder mounting part 45 is turned with respect to the base part 47 by a predetermined angle in a predetermined direction, the holder 9 is fixed by the clamp part 46. After that, while supplying a conducting wire from the supply nozzle 43, the main body part 42 is rotated to bind an end part on a winding-start side of the conducting wire of the shake correction coil 25 around the binding part 9k located at the left upper side in FIG. 5. After that, the holder mounting part 45 is turned to the clockwise direction by 45° with respect to the base part 47 and then, the subordinate head 44 is moved so that the tip end protruded part 9h is disposed in the recessed part of the subordinate head 44 and the contact face 44a of the subordinate head 44 is pressed against the tip end flat face of the protruded part 9g. In this state, while supplying the conducting wire from the supply nozzle 43, the main body part 42 and the subordinate head 44 are rotated together to wind the shake correction coil 25 around the protruded part 9g of one of two side faces 9d. In other words, the shake correction coil 25 is wound around the protruded part 9g between the contact face 44a of the subordinate head 44 and the abutting face 9f of the one of two side faces 9d.

When the shake correction coil 25 has been wound around the protruded part 9g of the one of the side faces 9d, the subordinate head 44 is retreated so that the contact face 44a is separated from the tip end face of the protruded part 9g and then the holder mounting part 45 is turned to the clockwise direction by 180° with respect to the base part 47. In this case, the crossover wire 25a is extended so as to pass the coil guide part 9v which is formed in the side face 9e of one of the two side faces 9e. Specifically, the crossover wire 25a which is extended from a lower end side of the shake correction coil 25 wound around the protruded part 9g of the one of the side faces 9d is, as shown in FIG. 6, passed through one of the recessed parts 9r of the one of the side faces 9e and, after having passed through the coil guide groove 9p, the crossover wire 25a is extended to an upper side along the inclined face 9s while contacting with the inclined face 9s of the other of the recessed parts 9r of the one of two side faces 9e. Further, the crossover wire 25a having passed through the inclined face 9s is extended along the inclined face 9u so as to contact with the inclined face 9u of one of the recessed parts 9t of the other of the side faces 9d.

After that, the subordinate head 44 is moved so that the tip end protruded part 9h of the other side face 9d is disposed in the recessed part of the subordinate head 44 and the contact face 44a is pressed against the tip end flat face of the protruded part 9g. In this state, while supplying the conducting wire from the supply nozzle 43, the main body part 42 and the subordinate head 44 are rotated together to wind the shake correction coil 25 around the protruded part 9g of the other side face 9d. When the shake correction coil 25 is wound around the protruded part 9g of the other side face 9d, the subordinate head 44 is retreated so that the contact face 44a is separated from the tip end face of the protruded part 9g and then the holder mounting part 45 is turned to the counterclockwise direction by 45° with respect to the base part 47. After that, while supplying the conducting wire from the supply nozzle 43, the main body part 42 is rotated to bind an end part on an end side of the conducting wire of the shake correction coil 25 around the binding part 9k located at the right lower side in FIG. 5.

When two shake correction coils 25 have been completed, the holder mounting part 45 is turned to the counterclockwise direction by 90° with respect to the base part 47 and then, the main body part 42 is rotated while supplying the conducting wire from the supply nozzle 43 to bind an end part on a winding-start side of the conducting wire for the shake correction coil 26 around the binding part 9k located at the left lower side in FIG. 5. After that, the holder mounting part 45 is turned to the clockwise direction by 45° with respect to the base part 47 and then, the subordinate head 44 is moved so that the tip end protruded part 9h is disposed in the recessed part of the subordinate head 44 and the contact face 44a is pressed against the tip end face of the protruded part 9g. In this state, while supplying the conducting wire from the supply nozzle 43, the main body part 42 and the subordinate head 44 are rotated together to wind the shake correction coil 26 around the protruded part 9g of one of two side faces 9e.

When the shake correction coil 26 has been wound around the protruded part 9g of the one of the side faces 9e, the subordinate head 44 is retreated so that the contact face 44a is separated from the tip end face of the protruded part 9g and then the holder mounting part 45 is turned to the clockwise direction by 180° with respect to the base part 47. In this case, the crossover wire 26a is wired along an outer peripheral face of the shake correction coil 25 which has been wound around the protruded part 9g of the other side face 9d. Specifically, the crossover wire 26a which is extended from a lower end side of the shake correction coil 26 wound around the protruded part 9g of the one of the side faces 9e is, as shown in FIG. 4, passed through on an upper side of the binding part 9k around which the end part on the end side of the conducting wire of the shake correction coil 25 has been bound and then, passed through one of the recessed parts 9r of the other side face 9d and, after the crossover wire 26a is passed along a lower side of the shake correction coil 25 so as to contact with an under face of the shake correction coil 25 having been wound around the protruded part 9g of the other side face 9d, the crossover wire 26a is wired so as to pass through the other recessed part 9r. Further, the crossover wire 26a having passed through the other recessed part 9r is wired along the inclined face 9u so as to contact with the inclined face 9u of one of the recessed parts 9t of the other side face 9e.

After that, the subordinate head 44 is moved so that the tip end protruded part 9h of the other side face 9e is disposed in the recessed part of the subordinate head 44 and the contact face 44a is pressed against the tip end face of the protruded part 9h. In this state, while supplying the conducting wire from the supply nozzle 43, the main body part 42 and the subordinate head 44 are rotated together to wind the shake correction coil 26 around the protruded part 9g of the other side face 9e. When the shake correction coil 26 is wound around the protruded part 9g of the other side face 9e, the subordinate head 44 is retreated so that the contact face 44a is separated from the tip end face of the protruded part 9g and then the holder mounting part 45 is turned to the counterclockwise direction by 45° with respect to the base part 47. After that, while supplying the conducting wire from the supply nozzle 43, the main body part 42 is rotated to bind an end part on an end side of the conducting wire of the shake correction coil 26 around the binding part 9k located at the right upper side in FIG. 5.

As described above, in this embodiment, the coil guide parts 9v for wiring the crossover wires 25a and 26a are formed in each of two side faces 9d and each of two side faces 9e. However, only the coil guide part 9v of one side face 9e is utilized for wiring the crossover wire 25a. Further, in this embodiment, the binding part 9k around which an end part on the end side of the conducting wire of the shake correction coil 25 is bound functions as a guide for the crossover wire 26a. In other words, in this embodiment, one binding part 9k functions as a guide for the crossover wire 26a.

In this embodiment, when the holder mounting part 45 on which the holder 9 is mounted is to be turned, the clamp part 46 is retreated so that the holder mounting part 45 on which the holder 9 is mounted is capable of being turned. Further, in this embodiment, a conducting wire which structures the shake correction coils 25 and 26 is a fusion wire having a fusion film and, after the shake correction coils 25 and 26 are wound around the protruded parts 9g, the shake correction coils 25 and 26 are heated together with the holder 9 and the conducting wires are fusion-bonded together.

(Principal Effects in this Embodiment)

As described above, in this embodiment, the coil guide parts 9v for wiring the crossover wires 25a and 26a are formed in the side faces 9d and 9e so as to be recessed from the abutting faces 9f, and a recessed amount of the coil guide part 9v from the abutting face 9f is set to be not less than an outer diameter of a conducting wire for the shake correction coils 25 and 26. Further, in this embodiment, the coil guide part 9v formed in one side face 9e is utilized for wiring the crossover wire 25a. Therefore, according to this embodiment, even when the shake correction coil 26 wound in the one side face 9e and the crossover wire 25a are disposed so as to be overlapped with each other in the front and rear direction, the shake correction coil 26 wound in the one side face 9e is prevented from riding on the crossover wire 25a. Accordingly, in this embodiment, the shake correction coil 26 can be orderly wound around the protruded part 9g of the one side face 9e.

In this embodiment, the guide parts 9w for guiding the crossover wires 25a and 26a from a lower side to an upper side are formed on both end sides of the respective side faces 9d and 9e in the circumferential direction. Therefore, according to this embodiment, even when winding directions of two shake correction coils 25 are the same as each other when viewed from one side in the right and left direction and, even when winding directions of two shake correction coils 26 are the same as each other when viewed from one side in the front and rear direction, the crossover wires 25a and 26a can be guided appropriately by utilizing the guide parts 9w. Further, in this embodiment, the coil guide groove 9p is formed along the side face on a lower side of the protruded part 9g and thus the crossover wire 25a is easily guided to the coil guide groove 9p by utilizing the protruded part 9g.

In this embodiment, the holder 9 is formed with the binding parts 9k which are respectively protruded from four corners of the holder 9 to outer sides. Therefore, according to this embodiment, for example, in comparison with a case that metal terminal pins around which end parts of conducting wires of the shake correction coils 25 and 26 are bound are inserted and fixed to the holder 9, the number of components of the coil unit 35 can be reduced and assembling process of the coil unit 35 can be simplified. Further, according to this embodiment, in comparison with a case that the binding parts 9k are protruded to a lower side, a structure of the coil winding machine 41 can be simplified. In other words, in a case that the binding part 9k is protruded to a lower side, a mechanism is required which is structured to turn the main body part 42 with a direction perpendicular to the paper face in FIG. 8 as an axial direction of the turning. However, according to this embodiment, this mechanism is not required and thus the structure of the coil winding machine 41 can be simplified. Further, in this embodiment, the binding parts 9k are protruded to the directions inclined by 45° with respect to the front and rear direction and the right and left direction. Therefore, the shake correction coils 25 and 26 wound around the protruded parts 9g can be prevented from interfering with the binding parts 9k.

In this embodiment, the binding parts 9k are formed on a lower end side of the holder 9 and the fixed part 37a of the flexible printed circuit board 37 is fixed to an end face on a lower side of the holder 9. Further, in this embodiment, an end part of the conducting wire bound around the binding part 9k is directly soldered to a solder land which is formed on the fixed part 37a. Therefore, according to this embodiment, electric connecting work between the end part of the conducting wire bound around the binding part 9k and the solder land are easily performed.

In this embodiment, the holder 9 is formed with the restriction parts 9j which restrict a swing range of the movable module 3, and the restriction parts 9j are disposed to a lower side of the shake correction coils 25 and 26. Therefore, according to this embodiment, even in a case that an end part of a conducting wire bound around the binding part 9k and a solder land formed on the fixed part 37a are soldered in each of four corners of the holder 9, a swing range of the movable module 3 can be restricted by using the restriction parts 9j disposed to the lower side of the shake correction coils 25 and 26.

Other Embodiments

Although the present invention has been shown and described with reference to a specific embodiment, various changes and modifications will be apparent to those skilled in the art from the teachings herein.

In the embodiment described above, each of two side faces 9d is formed with the coil guide part 9v for wiring the crossover wire 26a and each of two side faces 9e is formed with the coil guide part 9v for wiring the crossover wire 25a. However, it may be structured that the coil guide part 9v is formed in at least one side face 9e in which the crossover wire 25a is wired. Further, in the embodiment described above, the guide part 9w is formed on both end sides in the circumferential direction of each of two side faces 9d and on both end sides in the circumferential direction of each of two side faces 9e. However, it may be structured that the guide part 9w is formed only on one end side in the circumferential direction of two side faces 9d and 9e where the crossover wires 25a and 26a are passed. In this case, the guide part 9w may be structured of only the inclined face 9s and the inclined face 9u with which the crossover wires 25a and 26a are contacted.

However, like the embodiment described above, in a case that the coil guide part 9v is formed in each of two side faces 9d and in each of two side faces 9e and that the guide part 9w is formed on both end sides in the circumferential direction of each of two side faces 9d and on both end sides in the circumferential direction of each of two side faces 9e, winding order and a winding direction of the shake correction coils 25 and 26 for four protruded parts 9g can be arbitrarily selected and thus versatility of the holder 9 is high. In accordance with an embodiment of the present invention, no guide part 9w may be formed in the holder 9.

In the embodiment described above, the coil guide groove 9p is formed along the lower side face of the protruded part 9g. However, the coil guide groove 9p may be formed at a position separated from the lower side face of the protruded part 9g. Further, in the embodiment described above, the binding parts 9k are integrally formed in the holder 9. However, no binding parts 9k may be integrally formed in the holder 9. In this case, for example, metal terminal pins are inserted and fixed to the holder 9.

In the embodiment described above, one protruded part 9g is formed in each of the side faces 9d and 9e, and each of the shake correction coils 25 and 26 is wound around one protruded part 9g. However, two or more protruded parts 9g around which each of the shake correction coils 25 and 26 is wound may be formed in each of the side faces 9d and 9e. In this case, the side face 9d is formed with two or more protruded parts 9g in a separated state with a space therebetween in the front and rear direction, and the side face 9e is formed with two or more protruded parts in a separated state with a space therebetween in the right and left direction.

In the embodiment described above, a shape of an outer peripheral face of the holder 9 when viewed in the optical axis direction is a substantially rectangular shape. However, a shape of the outer peripheral face of the holder 9 when viewed in the optical axis direction may be a substantially regular hexagonal shape, a substantially regular octagonal shape or the like. Further, in the embodiment described above, the coil unit 35 is mounted on the photographing optical device 1. However, the coil unit 35 may be mounted on a device other than the photographing optical device 1. In other words, the coil in accordance with an embodiment of the present invention may be a coil other than the shake correction coils 25 and 26.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A coil unit comprising:
   an even number of coils; and
   a coil holding member structured to hold the even number of the coils, an outer peripheral face of the coil holding member comprising two or more side-face pairs, each of the side-face pairs comprising a pair of side faces parallel to each other;
   wherein each side face comprises a protruded part around which one of the coils is directly wound, the protruded part being protruded to an outer side of the coil holding member;
   wherein each side face comprises an abutting face with which one end face of the coil wound around the protruded part is abutted;
   wherein two pieces of the even number of the coils each of which is wound around each of the protruded parts of two side faces structuring the side-face pair is structured by using one conducting wire;
   wherein at least one of the side faces comprises a coil guide part for wiring a crossover wire which serially connects the coil wound around the protruded part of one side face structuring the side-face pair with the coil wound around the protruded part of the other side face structuring the side-face pair, the coil guide part being recessed from the abutting face; and
   wherein a recessed amount of the coil guide part recessed from the abutting face is set to be not less than an outer diameter of the conducting wire.

2. The coil unit according to claim 1, wherein
   the outer peripheral face of the coil holding member comprises two side-face pairs, and
   when each of the pair of the side faces structuring one of the two side-face pairs is referred to as a first side face, each of the pair of the side faces structuring the other of the two side-face pairs is referred to as a second side face, the coil wound around the protruded part of the first side face is referred to as a first coil, the coil wound around the protruded part of the second side face is referred to as a second coil, the crossover wire which serially connects two pieces of the first coil with each other is referred to as a first crossover wire, and the crossover wire which serially connects two pieces of the second coil with each other is referred to as a second crossover wire, the coil guide part for wiring the first crossover wire is formed in the second side face of at least one of a pair of the second side faces.

3. The coil unit according to claim 2, wherein
   the first crossover wire is wired so as to pass through the coil guide part which is formed in one of the pair of the second side faces, and
   the second crossover wire is wired along an outer peripheral face of one of the two pieces of the first coil.

4. The coil unit according to claim 3, wherein
   the coil guide part comprises a coil guide groove in which a part of the first crossover wire is disposed, and
   the coil guide groove is formed along the protruded part of the one of the pair of the second side faces.

5. The coil unit according to claim 4, wherein
   the coil holding member is formed in a tube shape, and
   one of the pair of the second side faces comprises a guide part for guiding the first crossover wire from one side to the other side in an axial direction of the coil holding member formed in the tube shape so as to be connected with the coil guide groove.

6. The coil unit according to claim 5, wherein
   the coil holding member comprises four binding parts each of which is bound with an end part of the conducting wire,
   a shape of the outer peripheral face of the coil holding member when viewed in the axial direction of the coil holding member formed in the tube shape is a substantially rectangular shape, and
   each of the four binding parts is protruded from each of four corners of the outer peripheral face of the coil holding member to a direction perpendicular to the axial direction.

7. The coil unit according to claim 6, wherein
   an outward shape of a tip end of the binding part is set to be larger than an outward shape of a base end of the binding part, and
   a tip end side of the binding part is a coming-off prevention part structured to prevent coming-off of the end part of the conducting wire bound around the binding part to the tip end side of the binding part.

8. The coil unit according to claim 6, further comprising a circuit board to which the end part of the conducting wire bound around the binding part is soldered and fixed, wherein the circuit board is fixed to an end face on a first direction side of the coil holding member wherein one side in the axial direction is the first direction side, and wherein the binding parts are formed on the first direction side of the coil holding member.

9. The coil unit according to claim 6, wherein one of the binding parts functions as a guide for guiding the second crossover wire.

10. The coil unit according to claim 2, wherein the coil holding member is formed in a tube shape, at least one end side of the first side face in a circumferential direction of the coil holding member comprises a guide part for guiding the second crossover wire from one side to the other side in an axial direction of the coil holding member formed in the tube shape, and at least one end side of the second side face in the circumferential direction of the coil holding member comprises a guide part for guiding the first crossover wire from the one side to the other side in the axial direction of the coil holding member formed in the tube shape.

11. The coil unit according to claim 2, wherein the coil holding member is formed in a tube shape, the coil holding member comprises four binding parts each of which is bound with an end part of the conducting wire, a shape of the outer peripheral face of the coil holding member when viewed in the axial direction of the coil holding member formed in the tube shape is a substantially rectangular shape, and each of the four binding parts is protruded from each of four corners of the outer peripheral face of the coil holding member to a direction perpendicular to the axial direction.

12. The coil unit according to claim 11, further comprising a circuit board to which the end part of the conducting wire bound around the binding part is soldered and fixed, wherein the circuit board is fixed to an end face on a first direction side of the coil holding member wherein one side in the axial direction is the first direction side, and wherein the binding parts are formed on the first direction side of the coil holding member.

13. The coil unit according to claim 2, wherein a shape of the outer peripheral face of the coil holding member when viewed in an axial direction of the coil holding member is formed in a substantially square tube shape, each of a pair of the first side faces and the pair of the second side faces comprises the coil guide part structured to be capable of wiring the first crossover wire, the coil guide part comprises a coil guide groove structured to be capable of disposing a part of the first crossover wire, and the coil guide groove is formed along the protruded part which is formed in each of the pair of the first side faces and the pair of the second side faces.

14. The coil unit according to claim 13, wherein the first crossover wire is wired so as to pass through the coil guide part and the coil guide groove which are formed in one of the pair of the second side faces, and the second crossover wire is wired along an outer peripheral face of one of the two pieces of the first coil.

15. The coil unit according to claim 13, wherein at least one end side of the first side face in a circumferential direction of the coil holding member comprises a guide part for guiding the second crossover wire from one side to the other side in an axial direction of the coil holding member formed in the tube shape, and at least one end side of the second side face in the circumferential direction of the coil holding member comprises a guide part for guiding the first crossover wire from the one side to the other side in the axial direction of the coil holding member formed in the tube shape.

16. The coil unit according to claim 13, wherein the coil holding member comprises four binding parts each of which is bound with an end part of the conducting wire, and each of the four binding parts is protruded from each of four corners of the outer peripheral face of the coil holding member in a direction perpendicular to the axial direction.

17. The coil unit according to claim 16, further comprising a circuit board to which the end part of the conducting wire bound around the binding part is soldered and fixed, wherein the circuit board is fixed to an end face on a first direction side of the coil holding member wherein one side in the axial direction is the first direction side, and wherein the four binding parts are formed on the first direction side of the coil holding member.

18. A photographing optical device comprising:

the coil unit defined in claim 1;

a camera module which comprises a lens and an imaging element and is fixed to the coil holding member;

a support body which swingably holds the coil unit; and a drive magnet which is fixed to the support body and is oppositely disposed to the coil.

19. The photographing optical device according to claim 18, wherein the outer peripheral face of the coil holding member is structured of two side-face pairs, when each of the pair of the side faces structuring one of the two side-face pairs is referred to as a first side face, each of the pair of the side faces structuring the other of the two side-face pairs is referred to as a second side face, the coil wound around the protruded part of the first side face is referred to as a first coil, the coil wound around the protruded part of the second side face is referred to as a second coil, the crossover wire which serially connects two pieces of the first coil with each other is referred to as a first crossover wire, and the crossover wire which serially connects two pieces of the second coil with each other is referred to as a second crossover wire, the coil guide part for wiring the first crossover wire is formed in the second side face of at least one of a pair of the second side faces, the first crossover wire is wired so as to pass through the coil guide part which is formed in one of the pair of the second side faces, and the second crossover wire is wired along an outer peripheral face of one of the two pieces of the first coil.

20. The photographing optical device according to claim 19, wherein the coil guide part comprises a coil guide groove in which a part of the first crossover wire is disposed, and the coil guide groove is formed along the protruded part of the one of the pair of the second side faces.

21. The photographing optical device according to claim 19, wherein the coil holding member is formed in a tube shape, at least one end side of the first side face in a circumferential direction of the coil holding member comprises a guide part for guiding the second crossover wire from one side to the other side in an axial direction of the coil holding member formed in the tube shape, and at least one end side of the second side face in the circumferential direction of the coil holding member comprises a guide part for guiding the first crossover wire from the one side to the other side in the axial direction of the coil holding member formed in the tube shape.

22. The photographing optical device according to claim 19, wherein
the coil holding member is formed in a tube shape,
the coil holding member comprises four binding parts each of which is bound with an end part of the conducting wire,
a shape of the outer peripheral face of the coil holding member when viewed in the axial direction of the coil holding member formed in the tube shape is a substantially rectangular shape, and
each of the four binding parts is protruded from each of four corners of the outer peripheral face of the coil holding member in a direction perpendicular to the axial direction.

23. A photographing optical device comprising:
the coil unit defined in claim 2;
a camera module which comprises a lens and an imaging element and is fixed to the coil holding member;
a support body which swingably holds the coil unit;
a drive magnet which is fixed to the support body and is oppositely disposed to the coil; and
a circuit board structured to supply an electric current to the first coil and the second coil;
wherein the coil holding member is formed in a tube shape,
wherein the coil holding member comprises four binding parts each of which is bound with an end part of the conducting wire,
wherein a shape of the outer peripheral face of the coil holding member when viewed in the axial direction of the coil holding member formed in the tube shape is a substantially rectangular shape,
wherein each of the four binding parts is protruded from each of four corners of the outer peripheral face of the coil holding member in a direction perpendicular to the axial direction,
wherein when one side in the axial direction is a first direction side, the four binding parts are formed on the first direction side of the coil holding member,
wherein the circuit board is fixed to an end face on the first direction side of the coil holding member,
wherein respective end parts of the conducting wire bound around the four binding parts are soldered and fixed to the circuit board, and
wherein the coil holding member comprises a restriction part which is disposed on the first direction side with respect to the coil and is structured to restrict a swing range of the camera module.

24. The photographing optical device according to claim 23, wherein
an outward shape of a tip end of the binding part is set to be larger than an outward shape of a base end of the binding part, and
a tip end side of the binding part is a coming-off prevention part structured to prevent coming-off of the end part of the conducting wire bound around the binding part to the tip end side of the binding part.

* * * * *